US006527926B2

(12) United States Patent
Woodruff et al.

(10) Patent No.: US 6,527,926 B2
(45) Date of Patent: Mar. 4, 2003

(54) ELECTROPLATING REACTOR INCLUDING BACK-SIDE ELECTRICAL CONTACT APPARATUS

(75) Inventors: Daniel J. Woodruff, Kalispell, MT (US); Kyle M. Hanson, Kalispell, MT (US); Robert W. Batz, Jr., Kalispell, MT (US); James T. Kuechmann, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 6 days.

(21) Appl. No.: 09/805,502

(22) Filed: Mar. 13, 2001

(65) Prior Publication Data

US 2001/0052457 A1 Dec. 20, 2001

Related U.S. Application Data

(63) Continuation of application No. 09/114,261, filed on Jul. 11, 1998, now Pat. No. 6,322,678.

(51) Int. Cl.[7] ................................................ C25B 9/00
(52) U.S. Cl. ......................... 204/297.08; 204/297.09; 204/297.1; 204/297.14
(58) Field of Search .................. 204/297.08, 297.09, 204/297.1, 297.14

(56) References Cited

U.S. PATENT DOCUMENTS

| 4,118,303 A | 10/1978 | Gibbs |
| 4,165,252 A | 8/1979 | Gibbs |
| 4,473,455 A | 9/1984 | Dean et al. |
| 5,078,852 A | 1/1992 | Yee et al. |
| 5,230,741 A | 7/1993 | Van de Ven et al. |
| 5,276,976 A | 1/1994 | Moslehi |
| 5,326,725 A | 7/1994 | Sherstinsky et al. |
| 5,377,708 A | 1/1995 | Bergman et al. |
| 5,405,518 A | 4/1995 | Hsieh et al. |
| 5,429,733 A | 7/1995 | Ishida |
| 5,431,421 A | 7/1995 | Thompson et al. |
| 5,437,777 A | 8/1995 | Kishi |
| 5,605,574 A | 2/1997 | Tsunashima et al. |
| 5,605,866 A | 2/1997 | McClanahan et al. |
| 5,620,581 A | 4/1997 | Ang |
| 5,762,751 A | 6/1998 | Bleck et al. |
| 5,985,126 A * | 11/1999 | Bleck et al. ............ 204/297.09 |

FOREIGN PATENT DOCUMENTS

WO    WO 98/02948    2/1992

* cited by examiner

Primary Examiner—Bruce F. Bell
(74) Attorney, Agent, or Firm—Perkins Coie LLP

(57) ABSTRACT

An apparatus for electroplating a workpiece is disclosed in which the apparatus includes a workpiece holding structure. The workpiece holding structure includes a workpiece support having at least one surface that is disposed to engage a front side of the workpiece and at least one electrical contact disposed for contact with at least one corresponding electrical contact on a back-side of the workpiece. The workpiece includes one or more electrically conductive paths between the at least one corresponding electrical contact and a front-side of the workpiece to facilitate electroplating of the front-side surface. An actuator is provided for driving the workpiece support between a first position in which the at least one electrical contact of the workpiece and the at least one contact of the workpiece holding structure are disengaged from one another, and a second position in which the at least one surface clamps the workpiece in a position in which the at least one electrical contact of the workpiece holding structure electrically engages the at least one electrical contact of the workpiece.

10 Claims, 17 Drawing Sheets

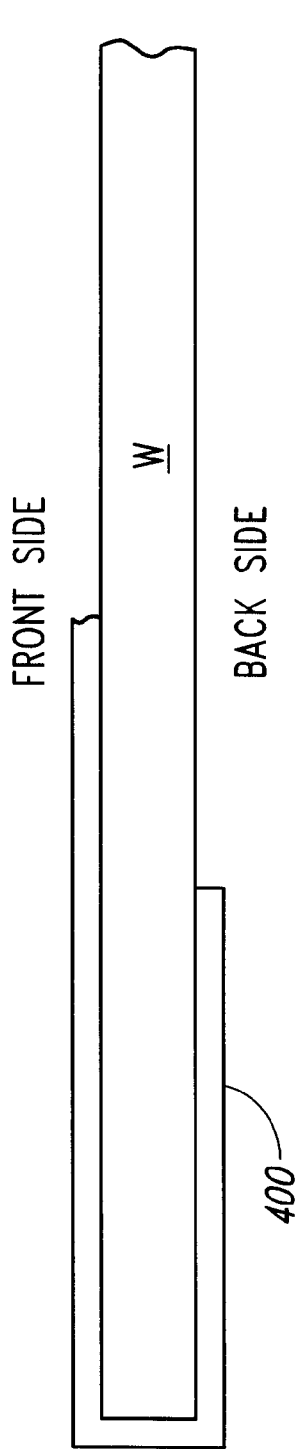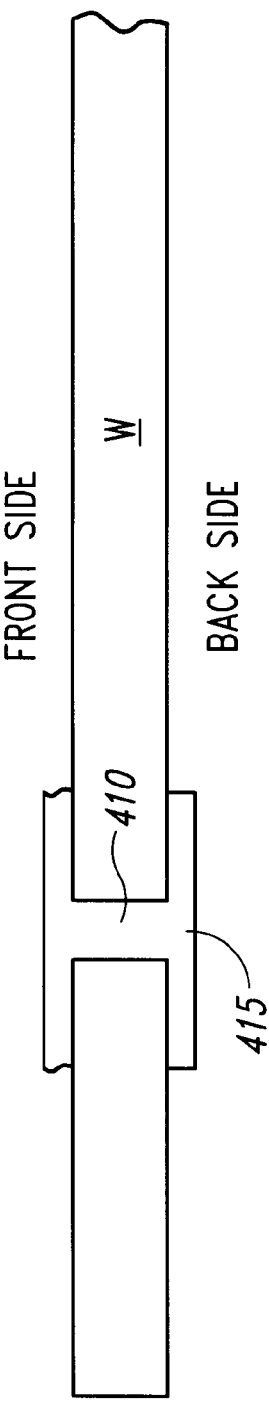
Fig. 17A
Fig. 17B

ELECTROPLATING REACTOR INCLUDING BACK-SIDE ELECTRICAL CONTACT APPARATUS

CROSS-REFERENCE TO RELATED APPLICATIONS

This application is a continuation of U.S. Ser. No. 09/114,261, filed Jul. 11, 1998 now U.S. Pat. No. 6,322,678.

STATEMENT REGARDING FEDERALLY SPONSORED RESEARCH OR DEVELOPMENT

Not applicable.

BACKGROUND OF THE INVENTION

Microelectronic circuits use metallization for a wide range of purposes. For example, metallization may be used to electrically interconnect the various components on a workpiece, such as the components formed in a semiconductor wafer. Further, the metallization may be used to form the actual electronic components on the workpiece. Such components include, for example, read/write heads, waveguides, inductors, etc.

There are a wide range of manufacturing processes that may be used to deposit the metallization on the workpiece in the desired manner. Such processes included chemical vapor deposition, physical vapor deposition, and electroplating. Of these, electroplating is often preferable since the capital and the operating costs of electroplating are generally less than other metallization processes. Electroplating can take place at ambient temperatures and ambient pressures. As such, strict control of the ambient temperature and pressure conditions is unnecessary.

Electroplating of workpieces that are used to form microelectronic circuits generally takes place in a reactor. One such reactor is illustrated generally at 2 of FIG. 1 and is described in more detailed in U.S. Ser. No. 08/988,333 filed Sep. 30, 1997 entitled "Semiconductor Plating System Workpiece Support Having Workpiece—Engaging Electrodes With Distal Contact Part and Dielectric Cover", the teachings of which are hereby incorporated by reference. As shown in FIG. 1, the reactor 2 generally comprises a rotor head 3 that supports the workpiece 4 so that the side of the workpiece to be processed (front side) is disposed to contact the upper surface of a plating bath 5 that is held in a reservoir 6 or the like. In this position, only the front side of the workpiece 4 contacts the plating bath 5 while the back side (side of the workpiece that is not to be processed at that time) preferably does not contact the plating bath. An anode assembly 7 is disposed in the plating bath 5 and is connected to a positive potential terminal of a plating power supply 8. A plurality of finger contacts 9 or the like contact the front side of the workpiece 4 and serve to electrically connect the workpiece 4 to a negative potential terminal of the plating power supply 8. In operation, the plating power supply provides an electrical potential difference between the anode and the workpiece which results in a chemical plating reaction at the front side of the workpiece in which the desired metal is deposited.

Although the foregoing reactor construction is suitable for many microelectronic electroplating applications, the present inventors have recognized that such a construction may be a disadvantage in other applications. These disadvantages are generally associated with the finger contacts. To electroplate a workpiece, electrical contact must be made with the surface of the workpiece to be plated. Usually only the active, front side of the workpiece is electrically conductive, and it is this surface to which electrical contact is made. Consequently, when the workpiece 4 is disposed so that it is in contact with the plating bath, the finger contacts 9 are also submerged in the plating bath. As such, the finger contacts 9 must be constructed to withstand the wet and harsh conditions of the plating bath environment. Construction of such contacts can be quite costly. For example, to withstand the environment, the finger contacts 9 may be constructed so that they have a platinum core that functions as the conductive portion of the finger, and an exterior skin that is comprised of titanium and a dielectric material such as PVDF. Even when such costly materials are used, the contacts may not be completely resistant to degrading in the plating bath. If the finger contacts are unable to withstand the plating bath environment over time, they will gradually degrade and become ineffective as conductive contacts. Further, such degradation may result in the introduction of contaminants into the plating bath, even before contact degradation is visibly apparent.

Other problems are also associated with this front side contact geometry. Making electrical contact to the front side of the workpiece usually involves complicated mechanisms which negatively impact reliability of the overall apparatus. A further potential problem results from the fact that plating takes place at an accelerated rate proximate the finger contacts. This accelerated deposition results in non-uniformly of the metallization as measured across the entire surface of the workpiece. As the microelectronics industry drives toward further miniaturization of microelectronic devices, such non-uniformities cannot be tolerated.

The present inventors have thus recognized that it would be advantageous in certain processes to provide an apparatus for electroplating a workpiece which reliably makes electrical contact to a back side (side not then in-process at the processing station) of the workpiece yet can electroplate the front side. The present inventors have also recognized that it would be advantageous to provide a back side contact which would simplify part design, reduce material costs, and improve apparatus reliability.

BRIEF SUMMARY OF THE INVENTION

An apparatus for electroplating a workpiece is disclosed in which the apparatus includes a workpiece holding structure. The workpiece holding structure includes a workpiece support having at least one surface that is disposed to engage a front side of the workpiece and at least one electrical contact disposed for contact with at least one corresponding electrical contact on a back-side of the workpiece. The workpiece includes one or more electrically conductive paths between the at least one corresponding electrical contact and a front-side of the workpiece to facilitate electroplating of the front-side surface. An actuator is provided for driving the workpiece support between a first position in which the at least one electrical contact of the workpiece and the at least one one contact of the workpiece holding structure are disengaged from one another, and a second position in which the at least one surface clamps the workpiece in a position in which the at least one electrical contact of the workpiece holding structure electrically engages the at least one electrical contact of the workpiece.

In accordance with one embodiment of the present invention, the workpiece holding structure includes a workpiece support member having fingers for engaging a front side of the workpiece, and back-side contact device that includes at least one electrical contact arranged to face a back side of the workpiece. One or more actuators drive the workpiece support toward the electrical contact to hold the workpiece resiliently clamped between the electrical contact and the fingers.

Numerous advantages and features of the present invention will become readily apparent from the following detailed description of the invention and the embodiments thereof, from the claims and from the accompanying drawings in which details of the invention are fully and completely disclosed as part of this specification.

BRIEF DESCRIPTION OF THE SEVERAL VIEWS OF THE DRAWINGS

FIGS. 17A and 17B illustrate to exemplary manners for providing a conductive path between the back-side of the workpiece and the front-side of the workpiece.

DETAILED DESCRIPTION OF THE INVENTION

Figure 1:
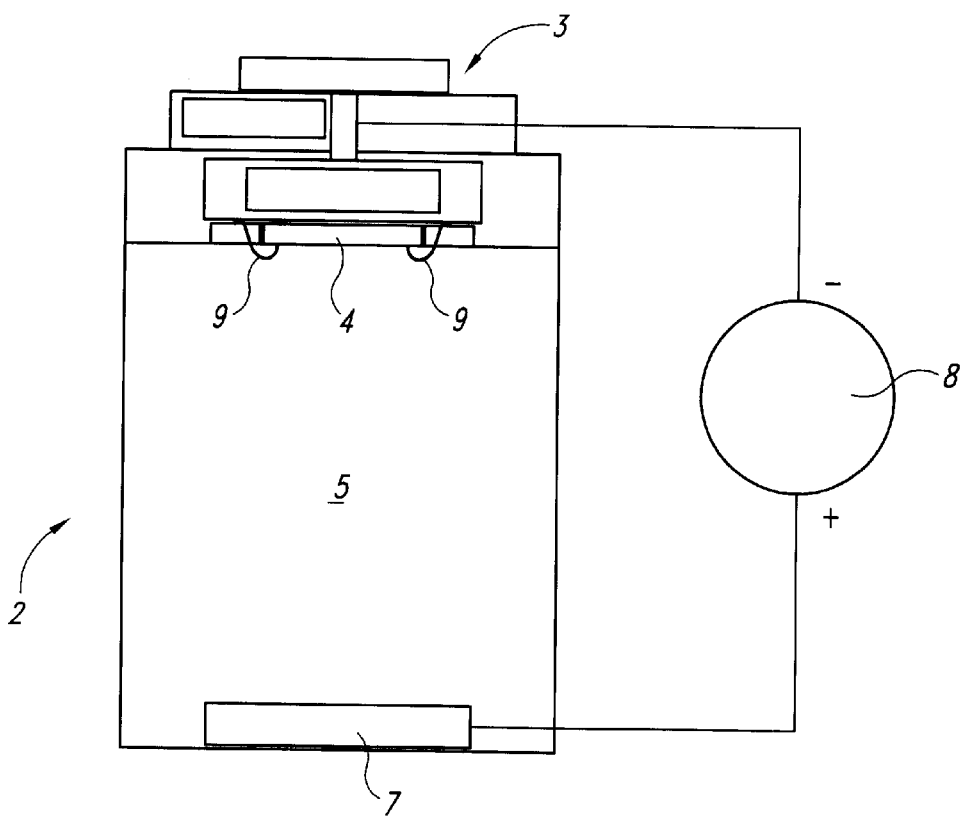
FIG. 1 is a schematic illustration of an electroplating reactor system.

While this invention is susceptible of embodiment in many different forms, there are shown in the drawings and will be described herein in detail specific embodiments thereof with the understanding that the present disclosure is to be considered as an exemplification of the principles of the invention and is not intended to limit the invention to the specific embodiments illustrated.

Figure 2:
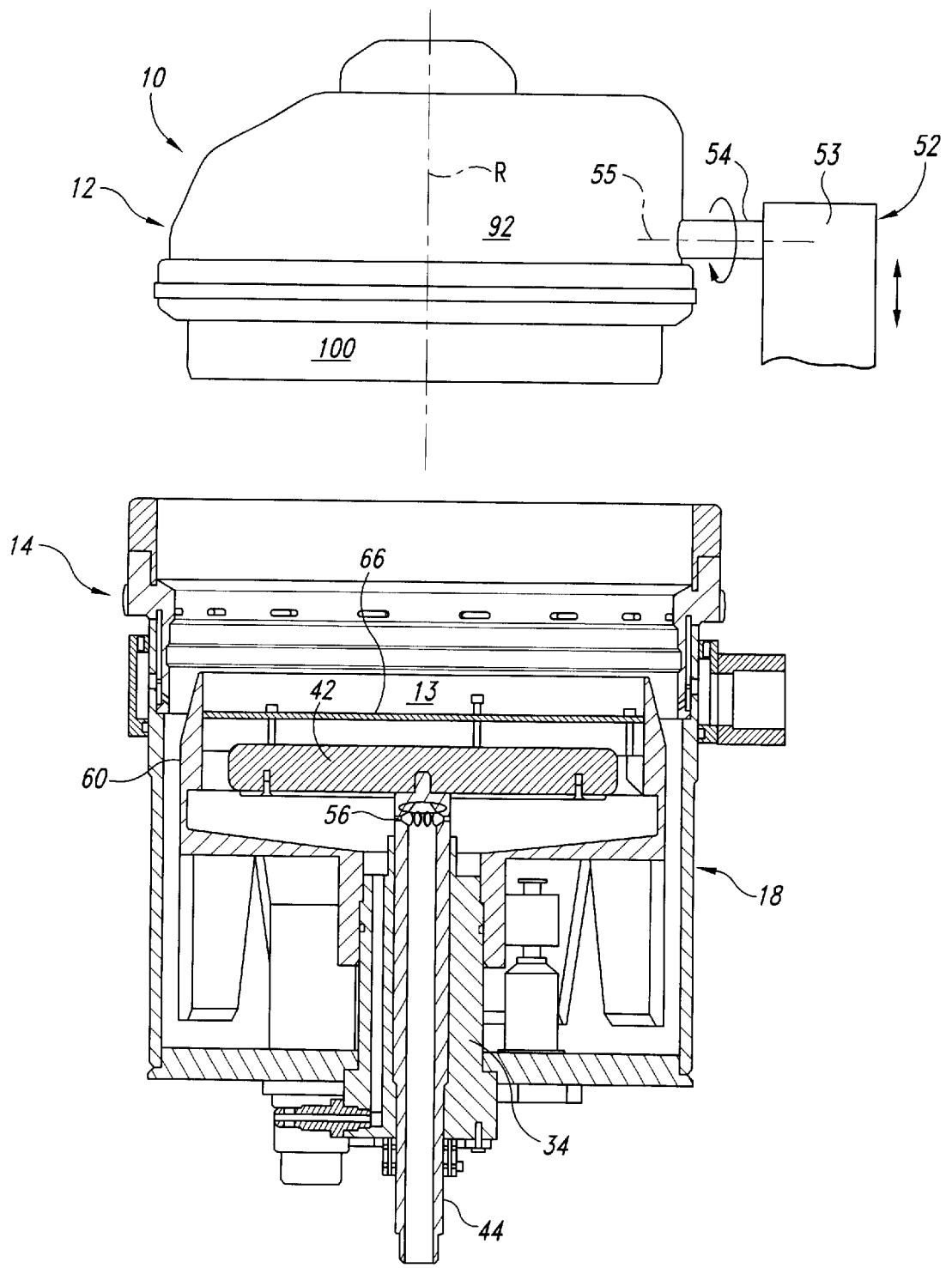
FIG. 2 is a partial sectional view of one embodiment of an electroplating reactor system that may incorporate the present invention.

FIG. 2 illustrates a reactor 10 in accordance with one embodiment of the present invention. Generally stated, the reactor comprises a processing head 12 and an electroplating bowl assembly 14. In the disclosed embodiment, the processing head 12 accepts the workpiece for processing, introduces the workpiece to the bowl assembly 14 for processing, and removes the workpiece from the bowl assembly 14 after processing for transition to, for example, another processing station. Additionally, the processing head 12 includes the requisite electrical contacts to provide electroplating power to the workpiece under process. Still further, the processing head 12 may provide the capability of rotating the workpiece about axis R during, for example, processing of the workpiece.

The processing head 12 of the illustrated embodiment includes a rotary drive assembly 92 and a workpiece rotor assembly 100. The workpiece rotor assembly 100 is constructed to support and hold a workpiece, such as a semiconductor, glass, or ceramic-based workpiece, during processing. Further, assembly 100 includes components that provide electrical plating power to the back-side of the workpiece. The workpiece rotor assembly 100 of the disclosed embodiment cooperates with the rotary drive assembly 92 to rotate the workpiece about spin axis R during processing.

Figure 3:
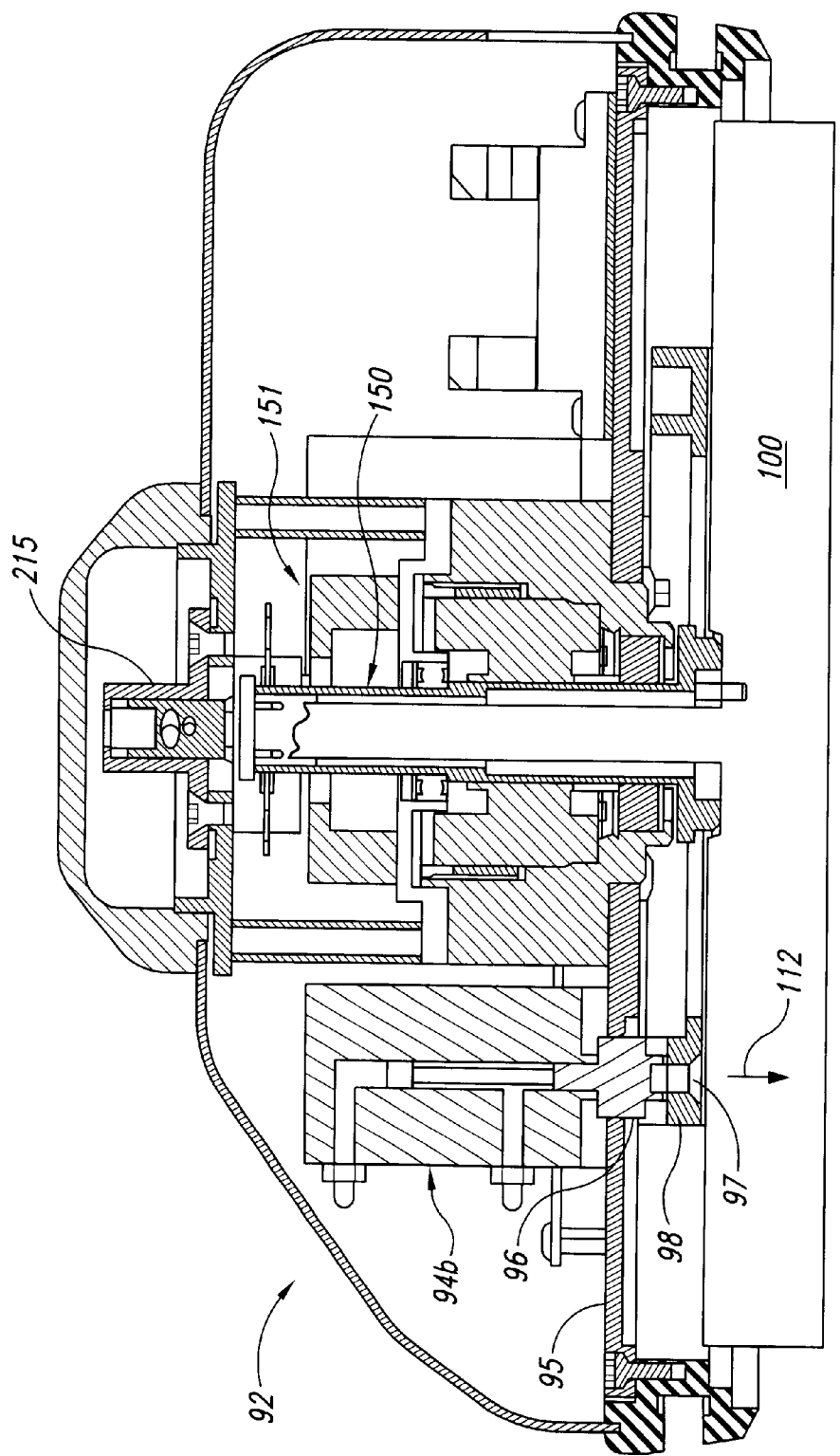
FIG. 3 is a sectional view of one embodiment of a processing head that may be used in the reactor system of FIG. 2.
Figure 4:
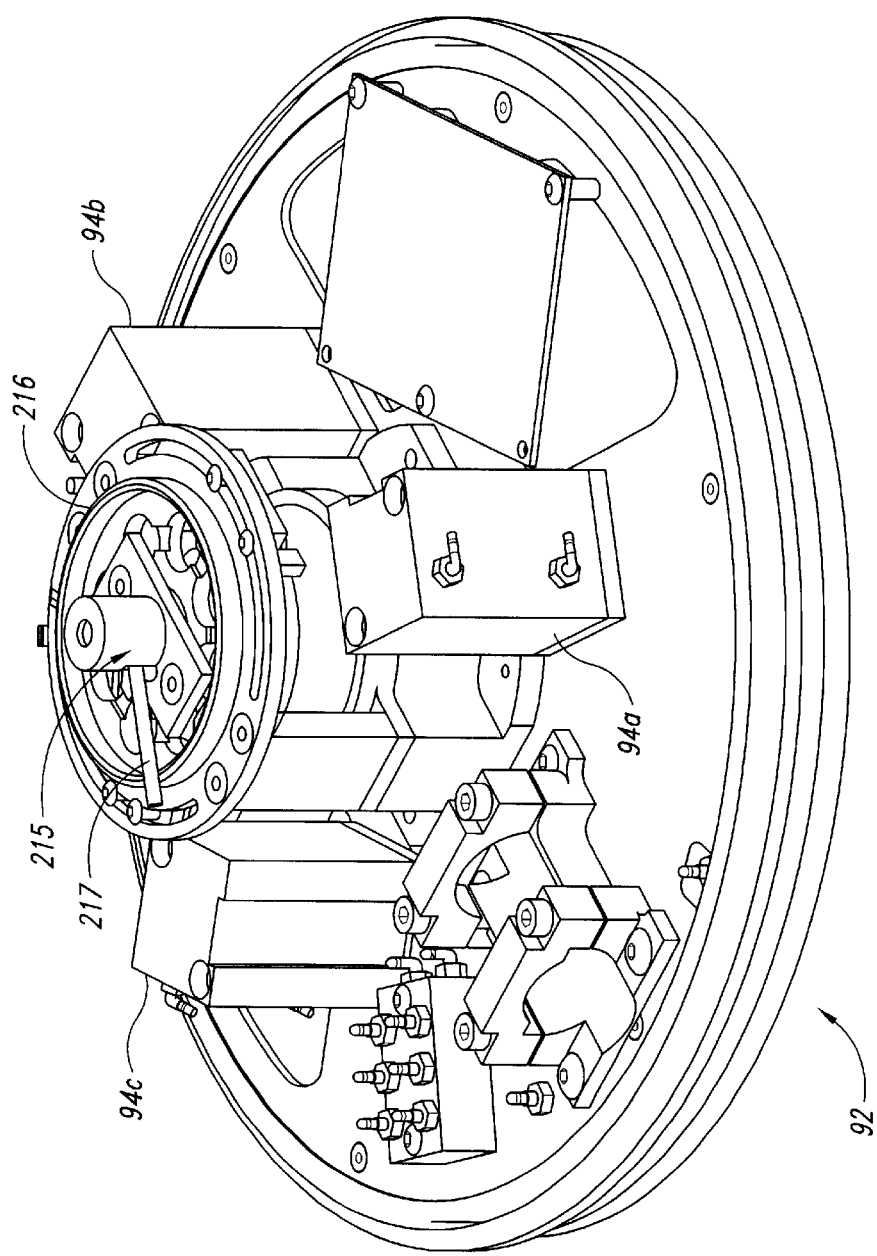
FIG. 4 is a perspective view of the processing head of FIG. 3.
Figure 5:
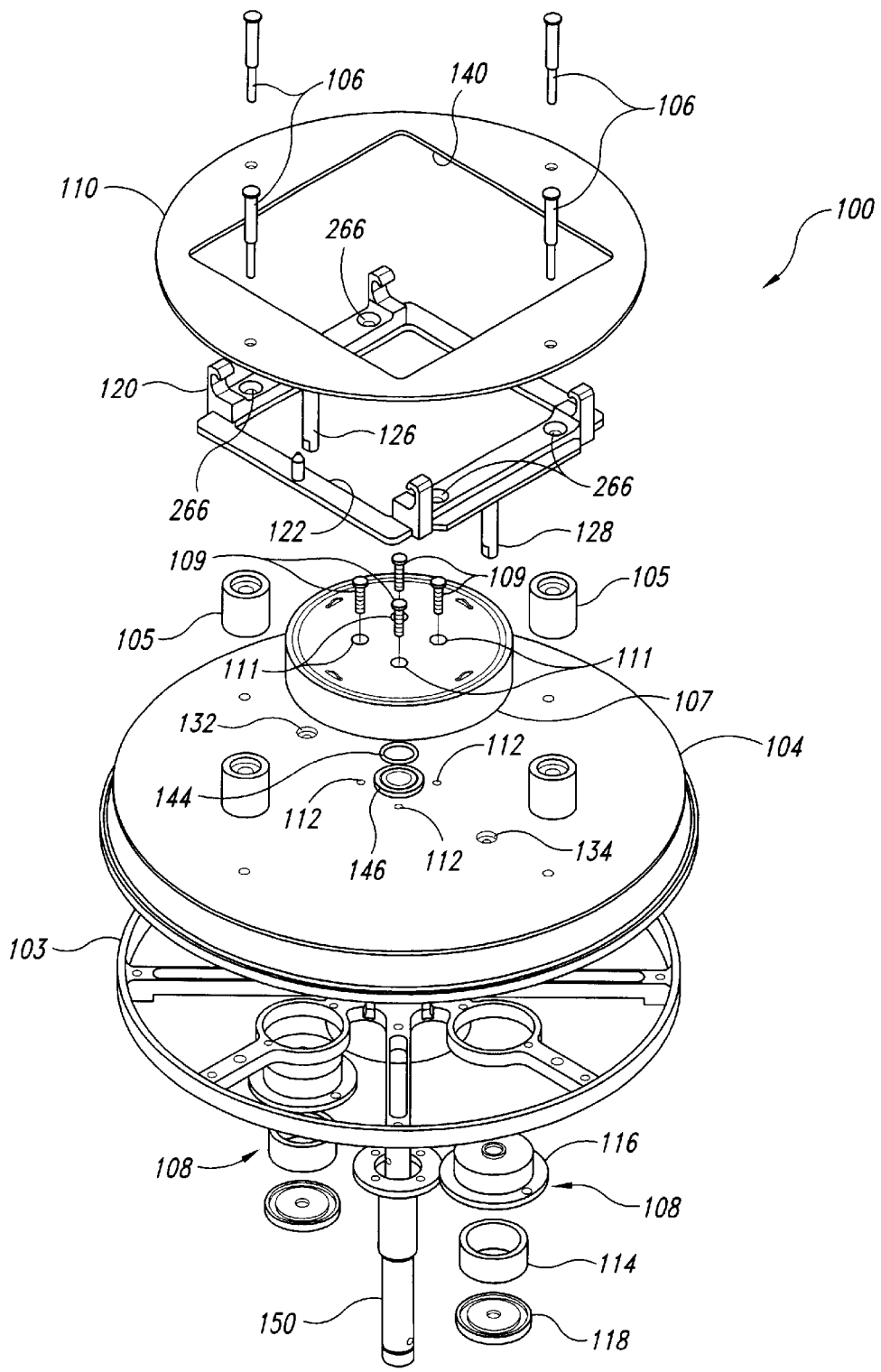
FIG. 5 is an exploded perspective view of a workpiece rotor assembly constructed in accordance with one embodiment of the present invention.

FIGS. 2 and 3 illustrate one embodiment of the rotor drive assembly 92. As illustrated, the rotor drive assembly 92 accepts a shaft 150 of the workpiece rotor assembly 100 which is driven by a rotary motor 151 to rotate the workpiece rotor assembly 100 about axis R.

The rotor drive assembly 92 also includes one or more components that are used to drive one or more corresponding components in the workpiece rotor assembly 100 to cause such corresponding components to engage and disengage from the workpiece. In the illustrated embodiment, such functions are performed by a plurality of linear pneumatic actuators 94a, 94b, 94c that are fixed to a base plate 95. Each of the actuators 94a, 94b, 94c includes a respective piston rod, such as at 96 of FIG. 3, that is connected to a thrust ring 98 by a securement 97. Actuation and de-actuation of the actuators 94a, 94b, and 94c drives the respective piston rods to urge the thrust ring 98 in the directions indicated by arrow 102. This causes the thrust ring 98 to engage and disengage from corresponding components in the workpiece rotor assembly 100. A more detailed description of this co-operation will be set forth below. Other means for providing such engagement and/or disengagement from the corresponding components in the workpiece rotor assembly 100 are likewise suitable for use.

Electroplating power is provided to the rotor assembly 100 for application to the workpiece during processing. If, as in the disclosed embodiment, the rotor assembly 100 is disposed to rotate the workpiece during processing, a substantially continuous electrical contact should be made between the rotor assembly 100 and the source of plating power during the rotation. To this end, a conductive rotary connection, shown generally at 215, is provided at an end of shaft 150. The rotary connection 215 is comprised of a stator contact 216 and a rotor contact 217. The stator contact 216 is connected to receive power from a terminal of a plating power supply (not shown). The rotor contact 217 is electrically connected to one or more components of the rotor assembly 100 that provide plating power to the workpiece. During rotation of the rotor assembly 100, the rotor contact 217 engages a conductive surface of the stator contact 216 to complete an electrical connection between the terminal of the plating power supply and the workpiece, Since the conductive surface of the stator contact 260 is continuous about the travel path of the rotor contact 217, the electrical connection between the plating power supply and the workpiece is maintained throughout the rotation of the rotor assembly 100.

FIGS. 5 through 8 illustrate one embodiment of the workpiece rotor assembly 100. Generally stated, the workpiece rotor assembly 100 is comprised of a back-side contact device 107, a workpiece support 120, one or more components used to provide relative movement between the contact device 107 and the workpiece support 120, and one or more components used to interconnect the rotor assembly 100 with the rotary drive assembly 92. Optionally, the rotor assembly 100 may include one or more current thieves, such as the one shown at 110 of FIG. 5.

In the illustrated embodiment, the rotor assembly 100 includes an inner hub portion 103 that is mounted within an outer hub portion 104 by a plurality of fasteners 105. The back-side contact device 107 is centered on and mounted to the outer hub portion 104 by a plurality of non-conducting securements 109 that proceed through securement apertures 111 and into corresponding threaded bores 112 of the outer hub portion 104.

Figure 9:
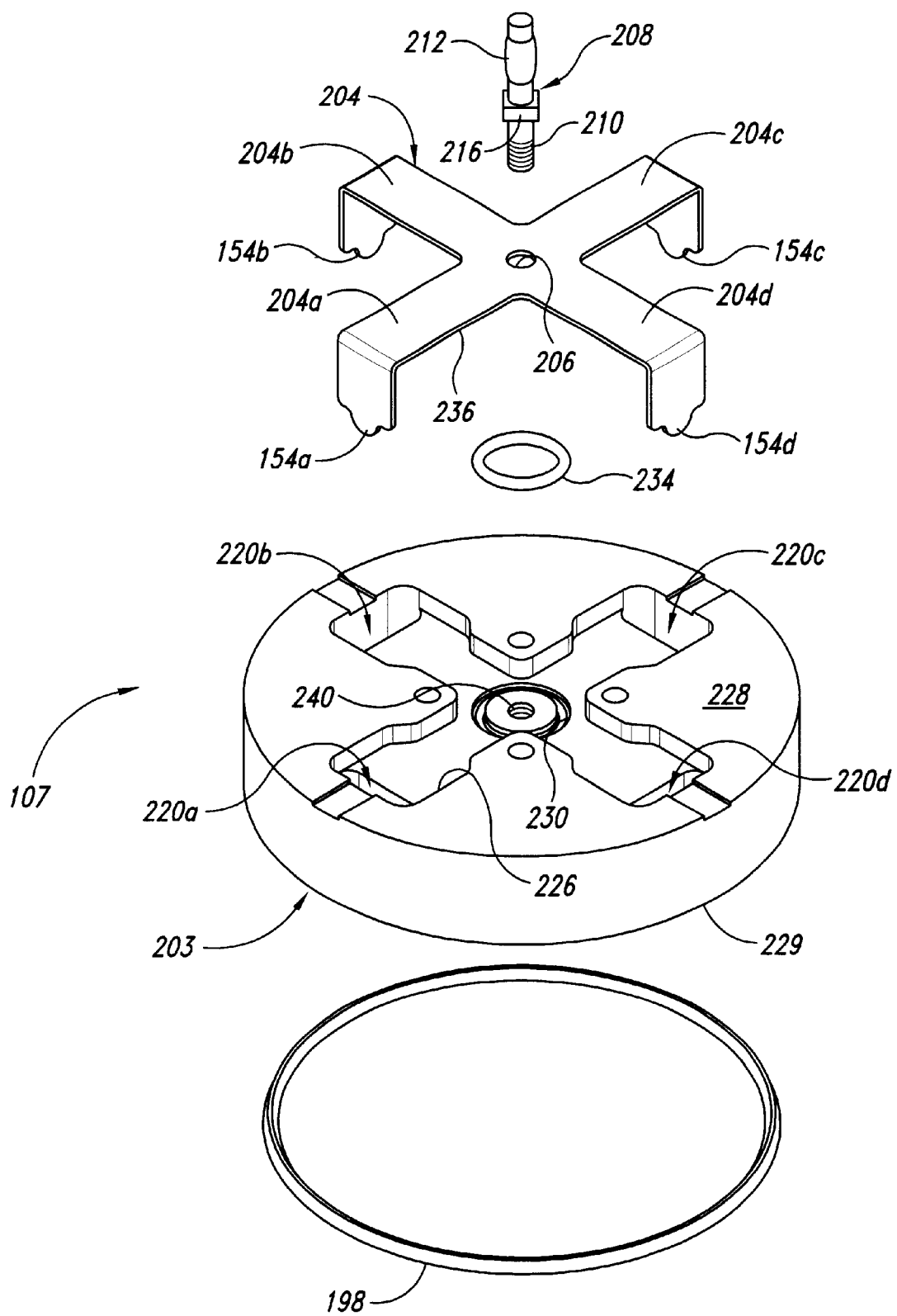
FIG. 9 is and exploded view of the components of one embodiment of a back-side contact device.
Figure 10:
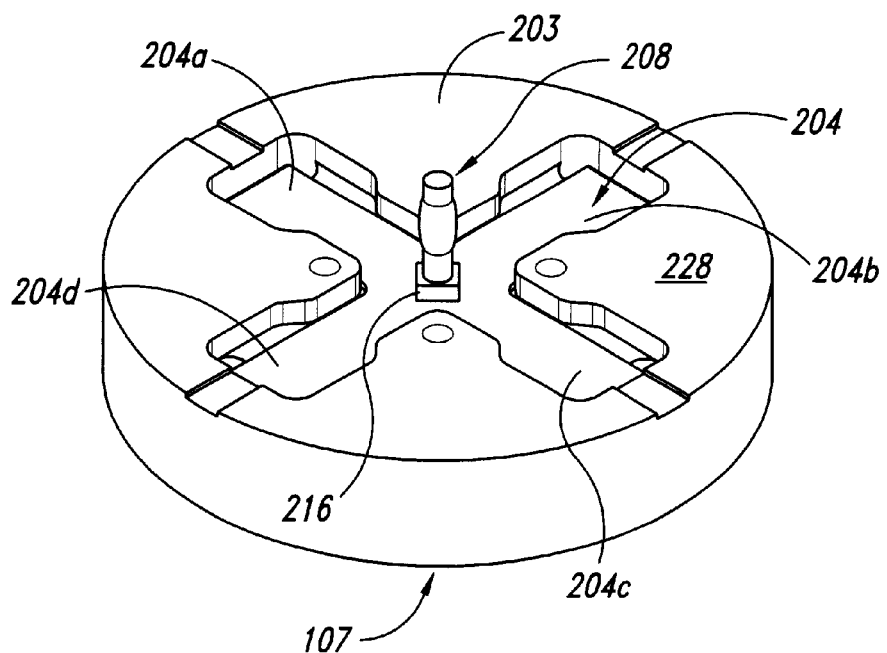
FIGS. 10 and 11 are perspective views of the back-side contact device of FIG. 9 after it has been assembled.
Figure 11:
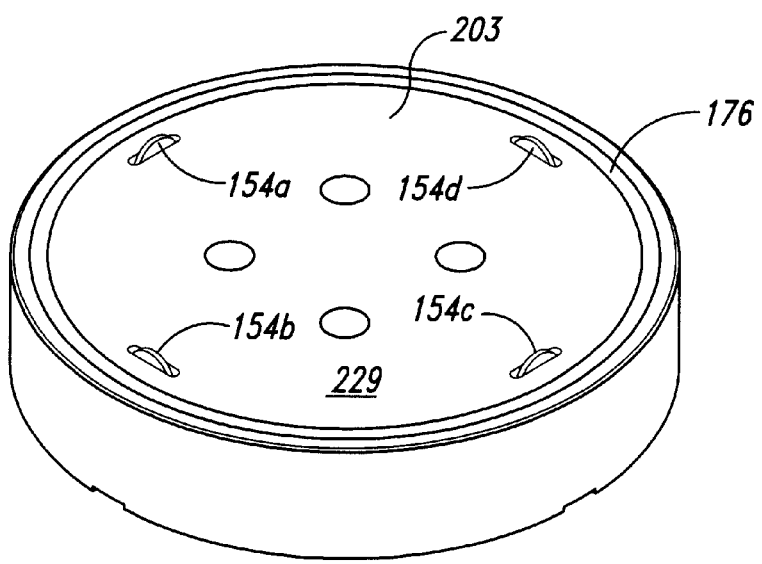

The back-side contact device 107 of the disclosed embodiment includes a disc shaped hub block 203 formed from a dielectric material. With reference to FIGS. 9–11, the hub block 203 includes one or more openings 220a–220d through which one or more contacts 154a–154d extend to contact corresponding conductive surfaces formed on a back-side of the workpiece that is under process. As best seen in FIG. 11, an annular groove 196 is disposed in the face of the block 203 and is dimensioned to receive a resilient O-ring 198. The O-ring 198 is disposed to engage the back-side of the workpiece under process to thereby isolate and protect the contacts 154a–154d from the plating environment.

In the disclosed embodiment, the contacts 154a, 154b, 154c, 154d are formed as upstanding members that extend from corresponding arms of a conductive cross-shaped member 204. The crossshaped member 204 is recessed into a corresponding cross-shaped recess 226 formed in the rear surface 228 of the block 203. The contacts 154a, 154b, 154c, 154d extend through openings 220a, 220b, 220c, 220d, and beyond surface 229 of the hub block 203. The arms of the cross-shaped member 204 are thin so as to form individual cantilever leaf springs that allow them to resiliently deform when the contacts 154a–154d engage the workpiece. Thus the contacts can individually conform to the surface of the workpiece W while ensuring copper electrical contact with the workpiece. Additionally, as the contacts are pushed against the workpiece, a slight scraping motion results from the leaf spring action. This scraping motion assists the contacts in penetrating any oxide film or other contaminants on the back-side of the workpiece to thereby improve electrical contact to the workpiece.

The cross-shaped member 204 is secured to the block 203 with a conductive electrode contact 208. The electrode contact 208 includes a threaded barrel portion 210 that terminates at a male contact element or plug 212. The threaded barrel portion 210 extends through a central aperture of the cross-shaped member and secures with a corresponding threaded aperture 240 that is disposed at a central portion of the hub block 203. When thus secured, the cross-shaped member 204 is held against hub block 203 by a square flange portion 216 of the contact 208. Flange portion 216 is preferably a standard dimension to accommodate a tool, such as a wrench, to facilitate assembly.

As illustrated in FIG. 9, a central, annular groove 230 is disposed in the rear surface 228 of the block 203 and is generally concentric with threaded aperture 240. A resilient O-ring 234 is disposed in the groove 230 and seals against an underside of the cross-shaped member 204. The O-ring assists in isolating the plug 208 and associated conductor 214 from the process chemistry.

Figure 6:
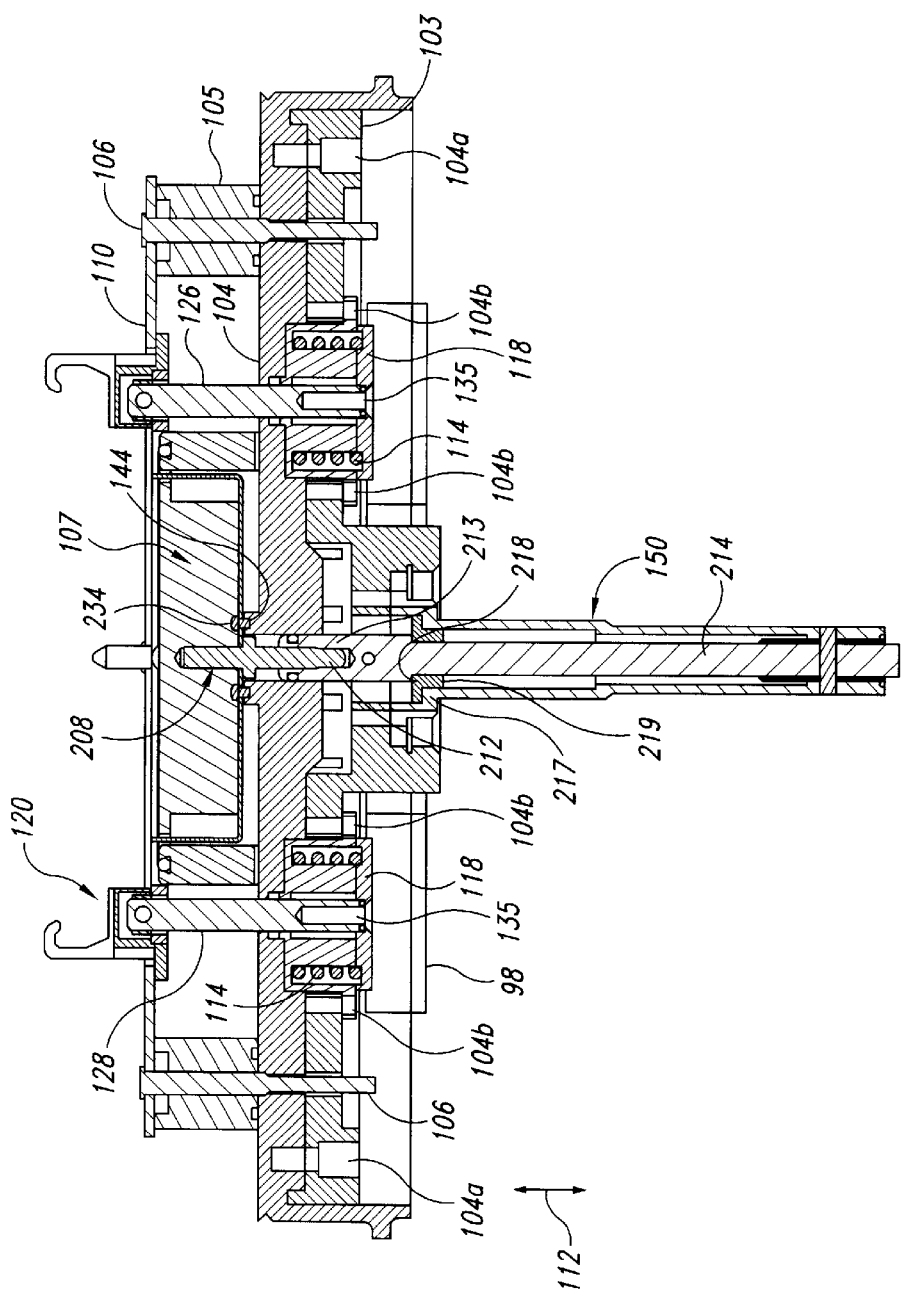
FIG. 6 is a cross-sectional view of the workpiece rotor assembly of FIG. 5 after it has been assembled.

As illustrated in FIG. 6, the plug 212 is connected to a corresponding socket 213 that is formed on a metallic conductor rod 214 or other electrical conductor. The rod 214 provides an electrically conductive path between the plug 212 and the rotor contact 217. The conductor rod 214 includes a shoulder 218 which overlies a retaining ring 219 which is backed by a shoulder 217 of the shaft 150. This configuration holds the socket stationary while the plug 212 is inserted during attachment of the back-side contact device 107 to the outer hub portion 104.

Figure 7:
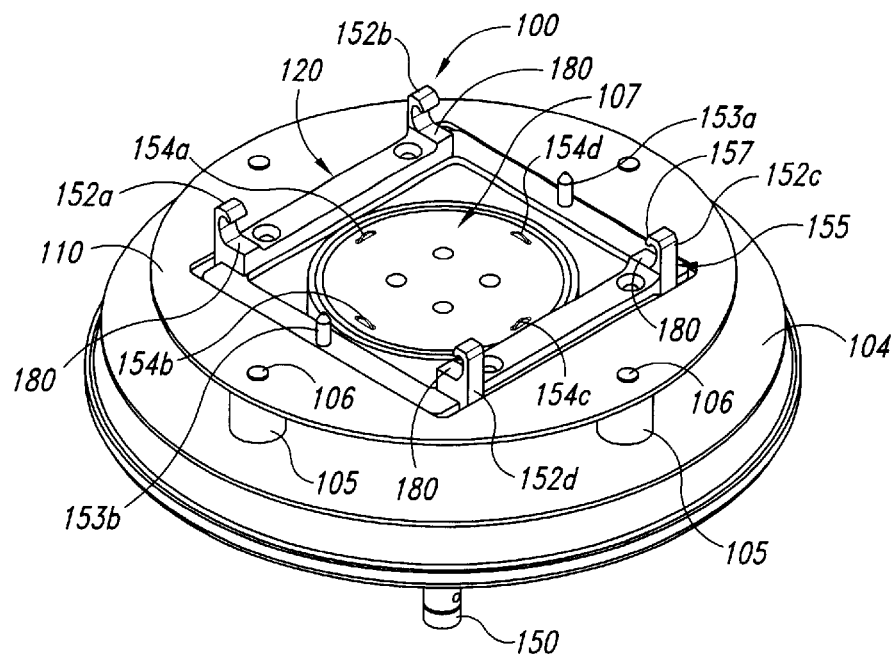
FIGS. 7 and 8 are perspective views of the workpiece rotor assembly.
Figure 8:
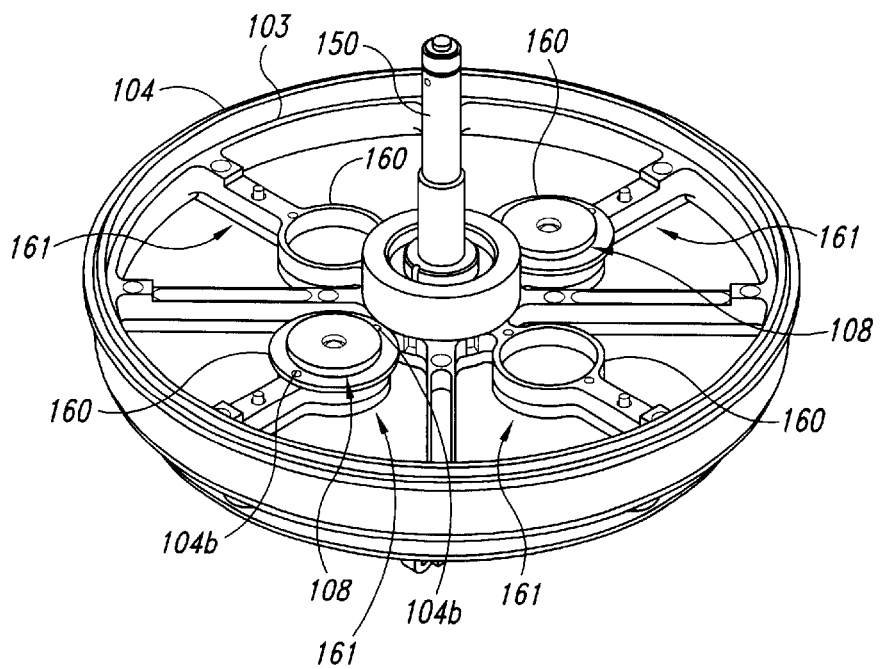

As illustrated in FIG. 7 the protruding contact 208 is presented, raised from the rear surface 228, to be received in the socket 213. The plug is inserted into the socket 213 as the hub block 203 is fastened onto the outer hub portion 104 by the securements 109. This causes the plug portion 212 to be resiliently captured within socket 213. When engaged in this manner, an O-ring 144 is held by the back-side contact place 107 within a corresponding groove 146 to seal a central region of the back-side contact device 107 against the outer hub portion 104. This arrangement assists in sealing the contact 208 from process chemistry.

With reference again to FIGS. 5–8, the rotor assembly 100 includes the workpiece support 120 which is mounted for relative movement with respect to the back-side contact device 107. In the illustrated embodiment, the workpiece support 120 is designed to accommodate a substantially square workpiece for processing. However, it will be recognized that other workpiece shapes may be accommodated with minor modifications to the workpiece support.

When designed for the processing of substantially square workpieces, the workpiece support 120 preferably has a square shape having a substantially square open central region 122 which is sized to be greater than the outside diameter of the back-side contact device 107. The workpiece support 120 also includes vertically arranged actuator shafts 126, 128 which penetrate apertures 132, 134 of the outer hub portion 104 and are fastened to bias members 108 which draw the workpiece support 120 toward the outer hub portion 104. The bias members 108 are disposed for contact by corresponding components in the rotor head assembly 92 that are used to drive the workpiece support 120 away from outer hub portion 104 to, for example, accept a workpiece that is to be processed.

In the illustrated embodiment, the bias members 108 are in the form of spring actuators that proceed through apertures 160 tormed in radial spokes 161 of the inner hub portion 103 and are secured to the outer hub portion 104 by fasteners 104b. Each actuator includes a coil spring 114 held partially within a cylindrical housing 116 and backed and retained by a spring cap 118. Actuator shafts 126 and 128 are fixed to the spring caps 118 by respective securements 135. Spring expansion force against the spring caps 118 draws the actuator shafts 126, 128, and the workpiece support 120, toward the outer hub portion 104.

Figure 12:
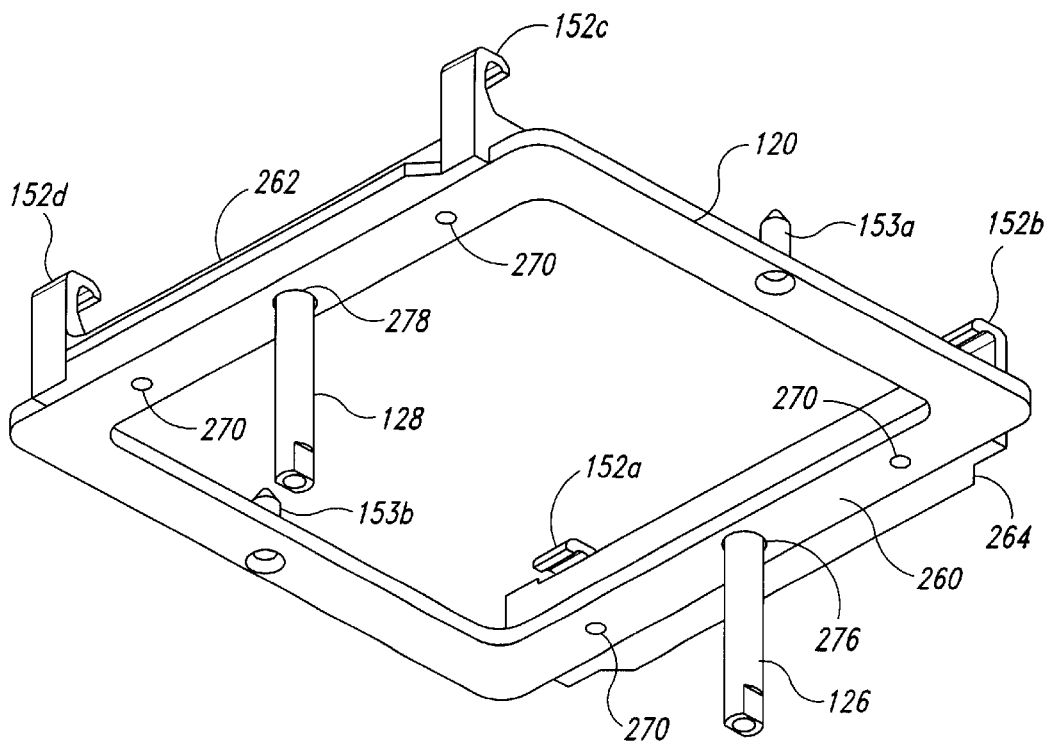
FIGS. 12–14 illustrate a workpiece support assembly constructed in accordance with one embodiment of the invention.
Figure 13:
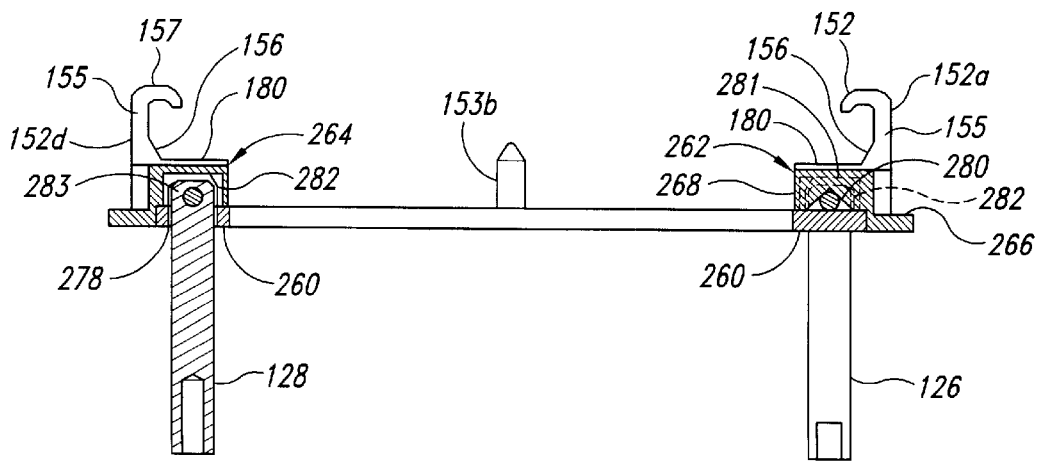
Figure 14:
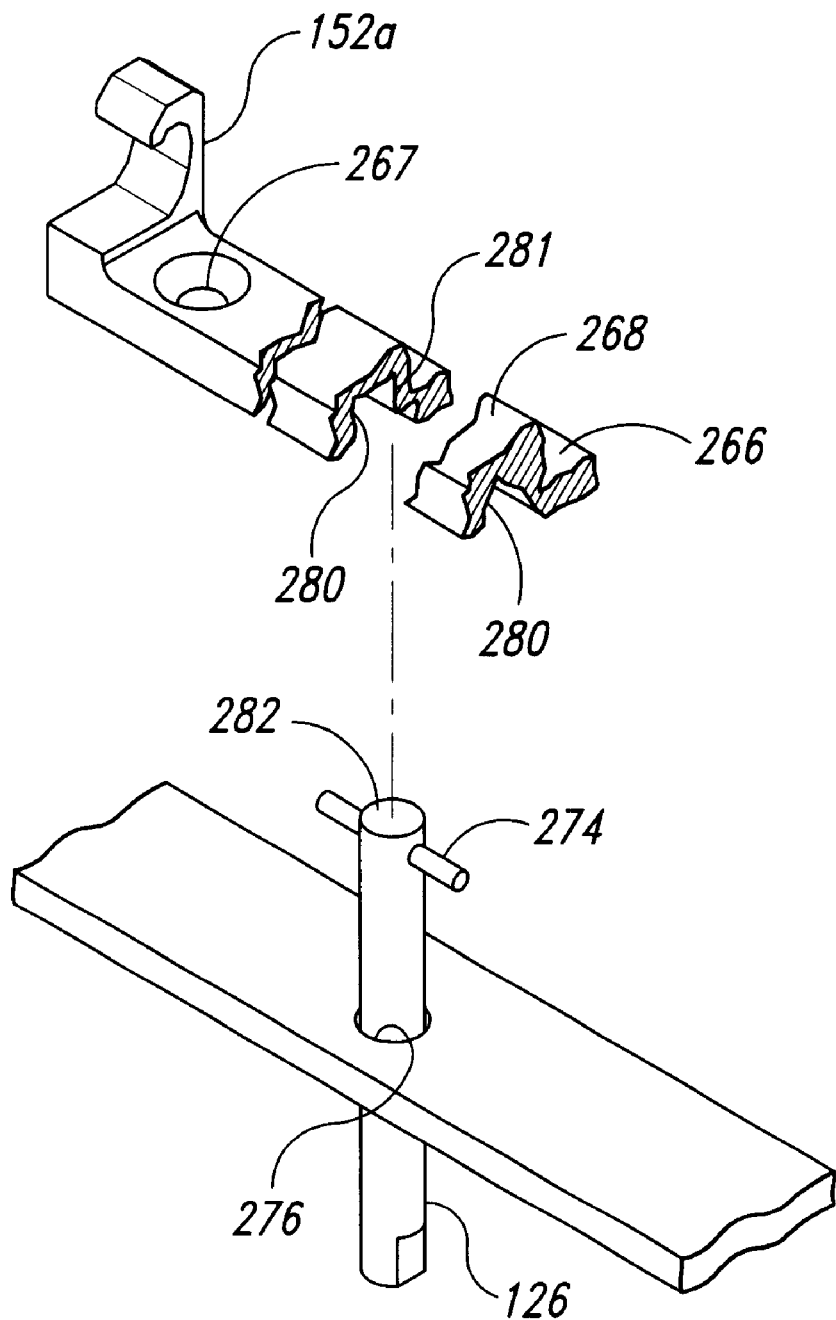

FIGS. 12–14 illustrate the workpiece support 120 in more detail. As shown, the workpiece support 120 includes a rectangular frame member 260 which, for example, can be formed of stainless steel. Fit onto the frame member 260 are first and second rails 262, 264 which each include an outer plate 266 aid an overlying platform 268. The rails 262, 264 are preferably formed from a dielectric material.

The fingers 152a, 152b are preferably formed integrally with the first rail 262 and the fingers 152c, 152d are preferably formed intergrally with the second rail. The fingers are also preferably formed from of a dielectric material. The fingers each include a vertical leg 155 and an overhang portion 157. Each of the vertical legs 155 includes a guide surface 156. On two sides of the frame are located upstanding lead-in pins 153a, 153b which precisely locate the workpiece on the frame in conjunction with the guide surfaces 156 of vertical legs 155.

The first and second rails are each fastened to the rectangular frame 260 by two countersunk fasteners 266 (see FIG. 14) which are screwed into holes 270 in the frame member 260. The actuator shafts 126, 128 penetrate through oval holes 276, 278 in the frame member 260.

The actuator shafts 126, 128 each have a cross pin 274 connection as shown in FIG. 14. The cross pins 274 are captured between the respective rails 262, 264 and the frame member 260 by fasteners 266. The first rail 262 includes a triangular guide channel 280 for precisely laterally locating and restraining the cross pin 274 of the first actuator shaft 126, while the second rail 274 includes a rectangular void 282 which allows lateral movement of the second actuator shaft 128. A blind hole 281 intersects the triangular guide channel 280 in the first rail, and loosely receives a top end 282 of the shaft 126. The triangular guide channel 280 captures the pin 274 on either side of the blind hole 281. The oval holes 276, 278 allow some lateral movements (left and right in the plane of FIG. 13 of the actuator shafts 126, 128) while restricting movement transverse thereto (into the plane of FIG. 13). Thus, the lateral position of the frame 260 is set by the first actuator shaft 126 while the second actuator shaft 128 can laterally float. This prevents binding of the tray during operation, due to misalignment or misadjustments.

As noted above, the workpiece rotor assembly 100 may employ one or more current thieves. In the illustrated embodiment, a single current thief 110 is used. The current thief 110 is formed as a conductive plate having a generally circular perimeter and a centrally disposed opening that is shaped and dimensioned to expose the workpiece to the plating solution.

The optional current thief 110 is supported by a plurality of dielectric standoffs 105. The standoffs 105 are preferably fastened to the outer hub portion 104 by electrically conducting studs 106 which extends through the standoffs 105 and the inner hub portion 103 to ultimately terminate at an electrical connection for the current thief 110. The hub portions 103, 104 and standoffs are composed of a dielectric material. A further embodiment of a current thief assembly suitable for use in the present invention is set forth in U.S. Ser. No. 08/933,450, filed Sep. 18, 1997, and titled "Cathode Current Control System For A Wafer Electroplating Apparatus", the teachings of which are hereby incorporated by reference.

FIGS. 15A through 15F illustrate operation of the processing head 12 during workpiece loading and unloading. FIGS. 16A through 16D illustrate the cooperation between the workpiece W and workpiece rotor assembly 100 at various operational steps corresponding to FIGS. 15A through 15F.

Figure 15A:
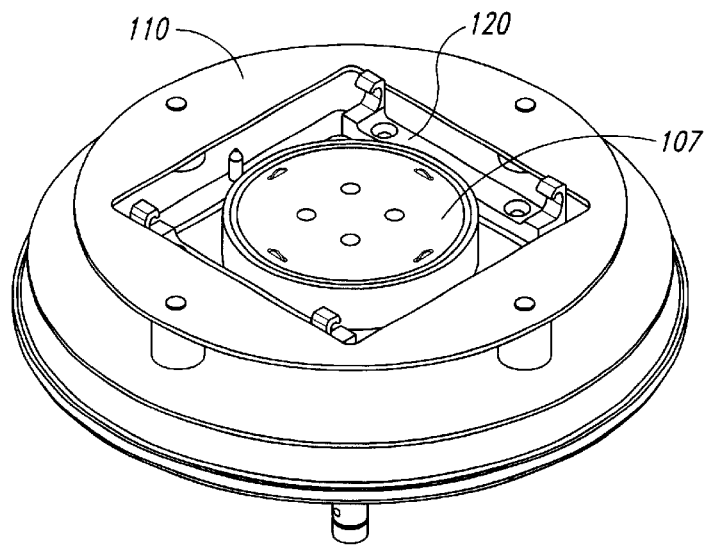
FIGS. 15A–15F illustrate the disclosed workpiece rotor assembly during loading and unloading of the workpiece.

FIG. 15A illustrates the workpiece support 120 in a rest state. In this state, the workpiece support 120 is pulled toward outer hub member 104 by actuators 108.

Figure 15B:
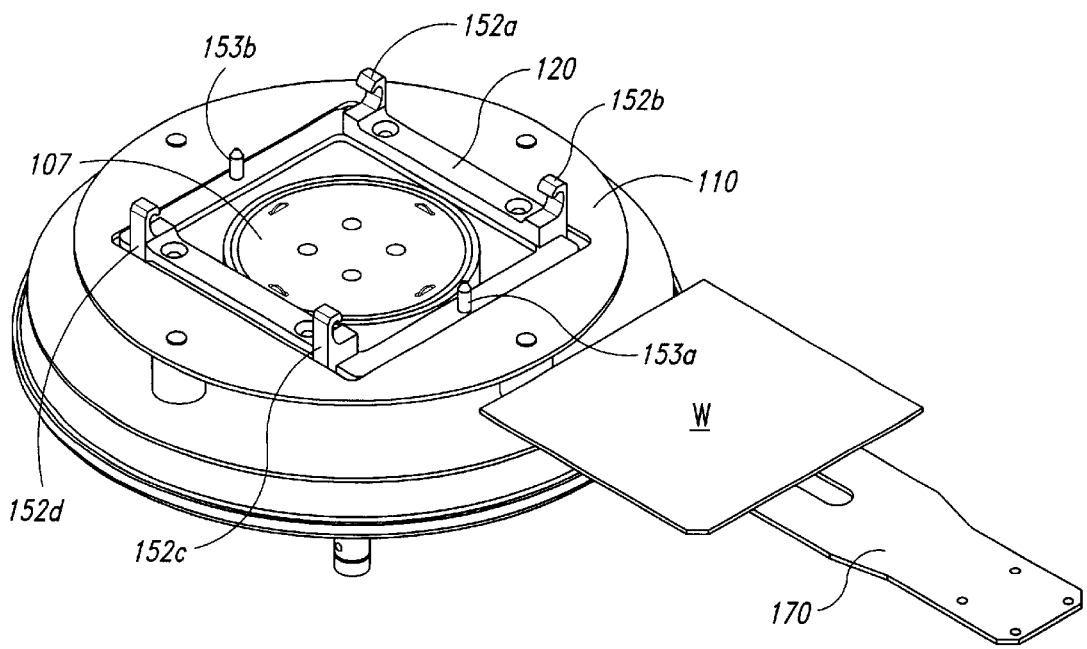
Figure 16A:
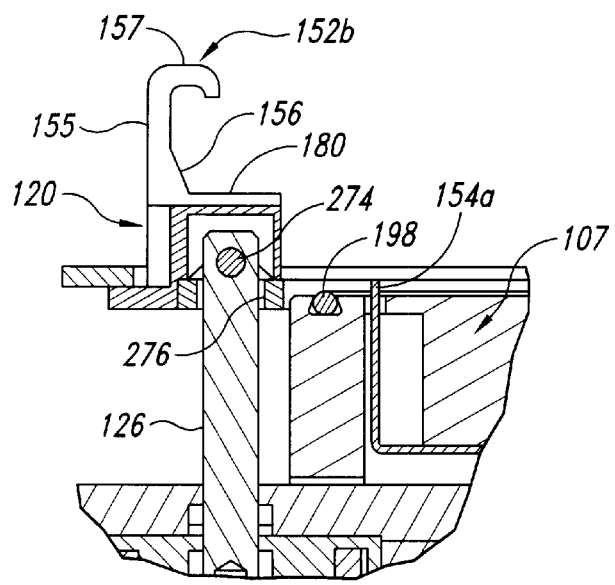
FIGS. 16A–16D are sectional views of the workpiece rotor assembly at various operational states illustrated in FIGS. 15A–15F.

FIGS. 15B and 16A show the workpiece rotor assembly 100 in a state in which it is ready to receive workpiece W. In this state, the wafer support 120 is driven to a position above a surface of the thief 110 thereby making it ready to receive the workpiece W from an end effector 170 of an automation robot (not shown). In the illustrated embodiment, the workpiece support 120 is driven to this position when the actuators 94a, 94b, 94c drive the thrust ring 98 against the spring caps 118 (see FIG. 6). This applies a compressive force to actuators 108 and urges the actuator shafts 126 and 128 and the arrest of the wafer support assembly away from the surface of the outer hub portion 104. FIG. 16A illustrates the workpiece support 120 in this elevated position. In the position illustrated in FIG. 16A, the shoulders 180 are raised above the contacts, such as the contact 154a shown.

Figure 15C:
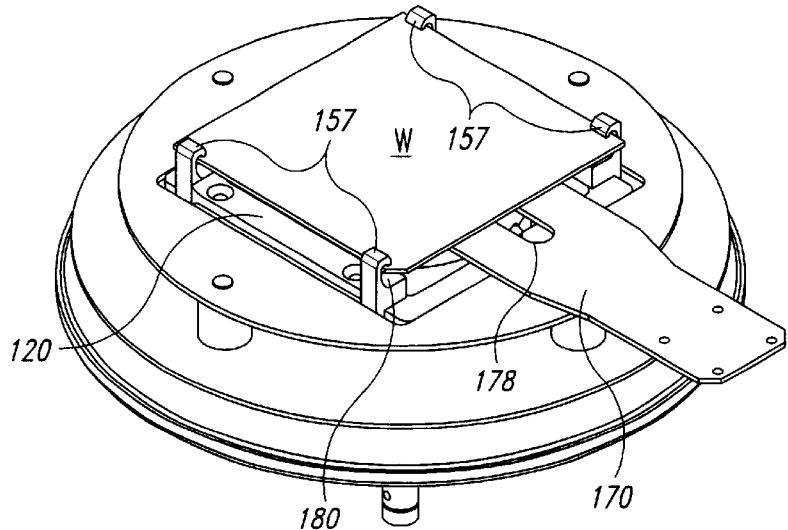
Figure 16B:
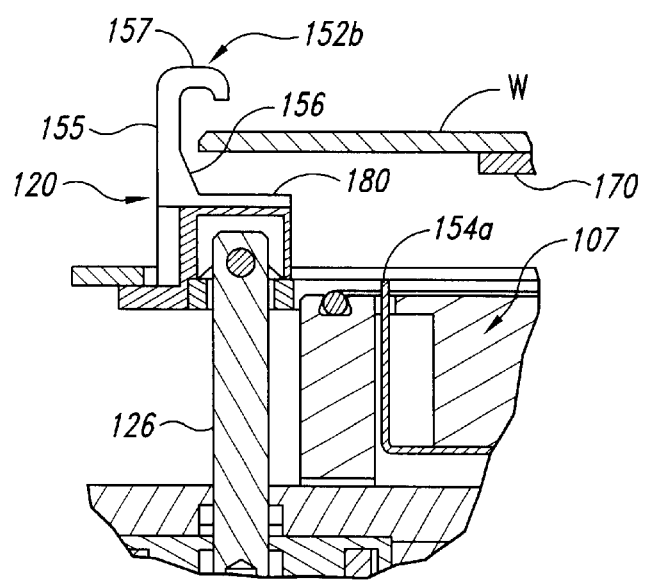

FIGS. 15C and 16B illustrate delivery of the workpiece W onto the workpiece support 120. Upon initial delivery, the workpiece W is disposed beneath the overhang portions 157 of each finger 152a, 152b, 152c and 152d, and above the lead-in pins 153a, 153b. The end effector 170 includes a slot or notch 178 for avoiding the lead-in pin 153a thereby allowing the end effector to deposit and withdraw the workpiece W without obstruction.

Figure 15D:
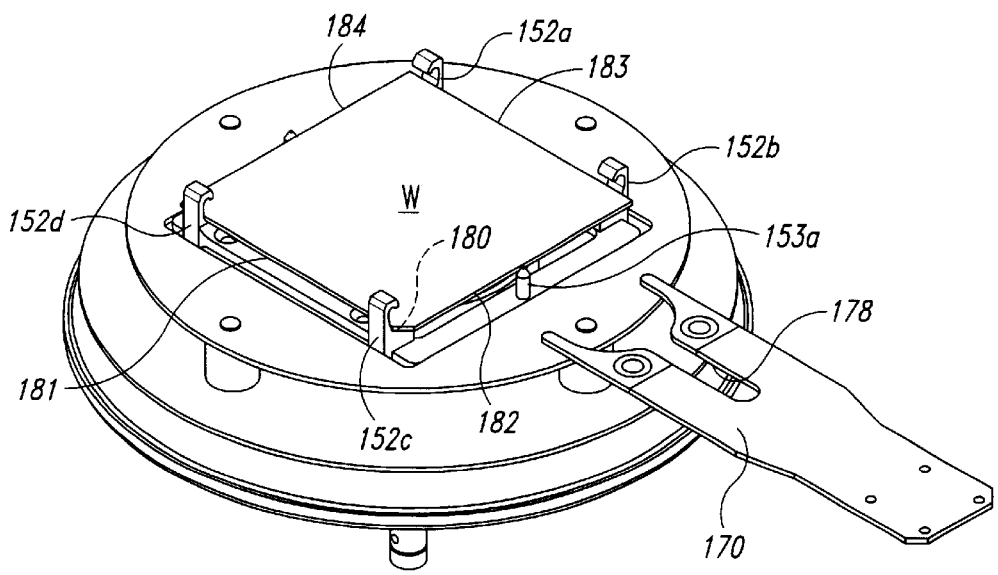
Figure 16C:
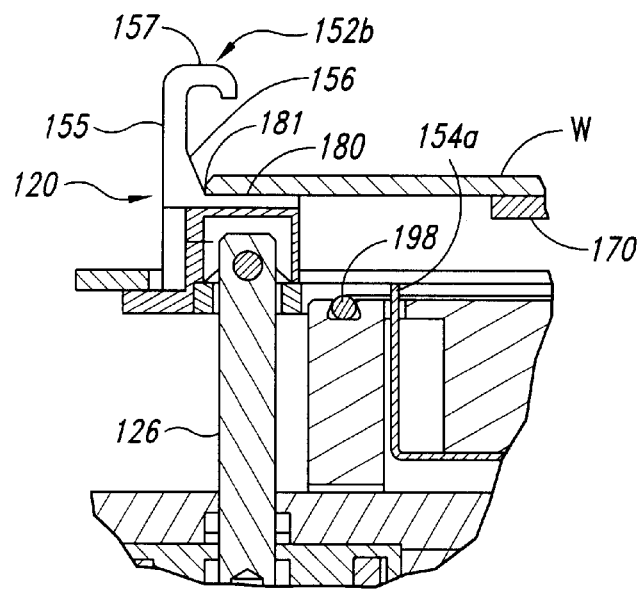

In FIGS. 15D and 16C, the end effector 170 has been withdrawn. After withdrawal, the workpiece W is located between the lead-in pins 153a, 153b and deposited onto shoulders 180 located beneath the overhang portions 157 of each finger 152a, 152b, 152c, 152d. To withdraw the end effector 170 (without also withdrawing the workpiece) the end effector 170 and workpiece can be lowered until a trailing edge 182 of the workpiece abuts the lead-in pin 153a, preventing the workpiece from remaining on the end effector as the end effector is withdrawn. As the end effector 170 is lowered, the inclined guide surface 156 of each vertical leg 155 of each of the fingers guides the lateral edges of the workpiece W so that it is placed at the proper location on the workpiece support 120.

Figure 15E:
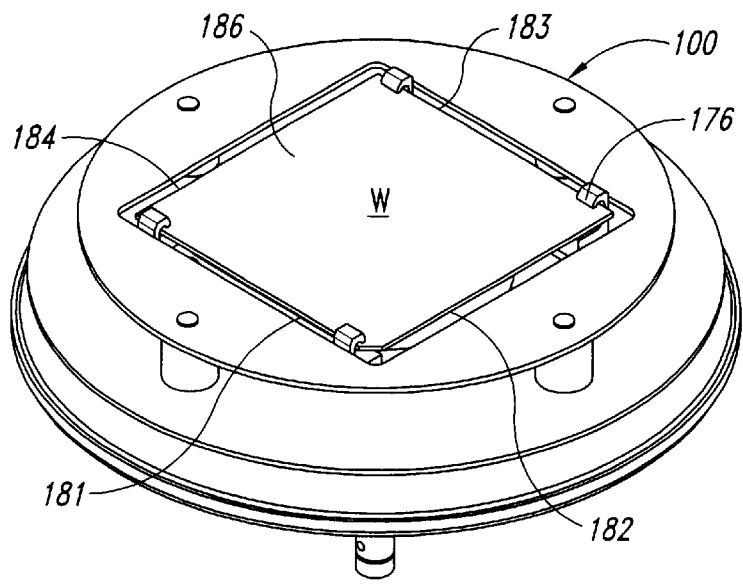
Figure 15F:
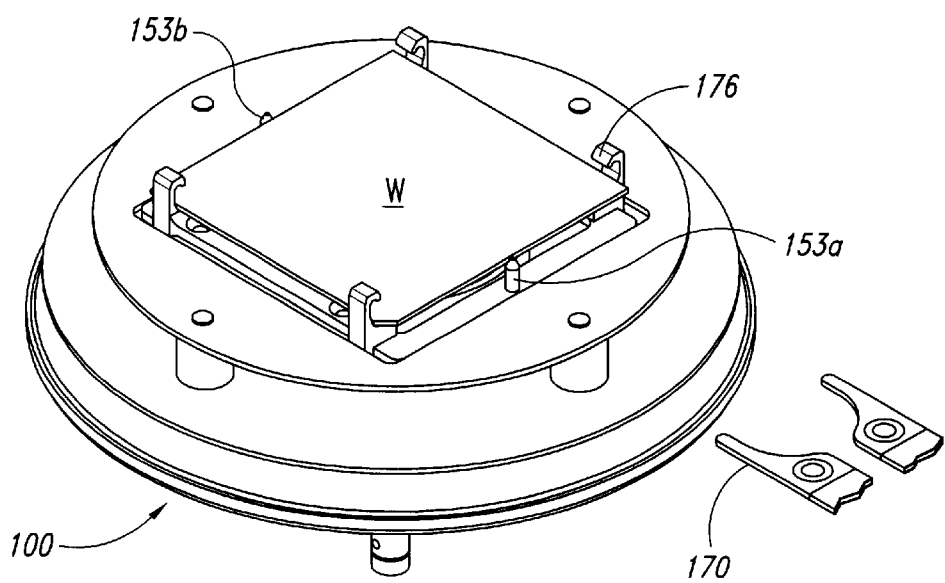
Figure 16D:
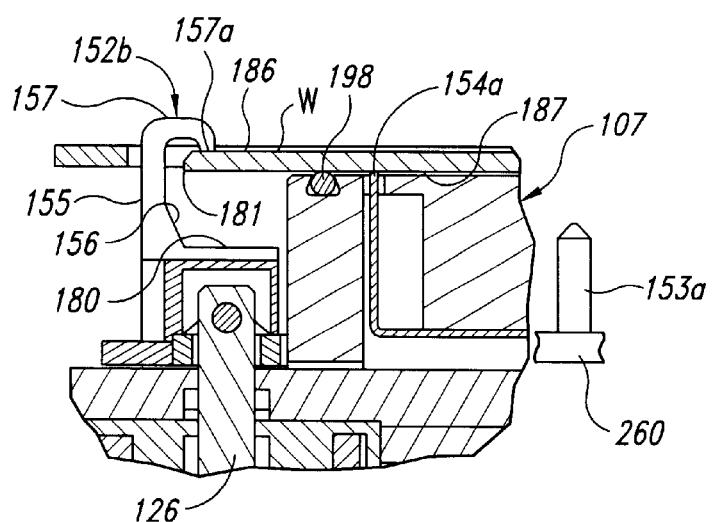

FIGS. 15E and 16D illustrate the manner in which the workpiece W is clamped by the workpiece support 120 against the back-side contact device 107 for processing. To effect this clamping, actuators 94a, 94b, and 94c are deactivated thereby causing thrust ring 98 to disengage from the spring caps of the actuators 108. This allows the actuators 108 to return to their natural condition in which they drive the workpiece support 120 to clamp the workpiece W against the back-side contact device 107. In this position, the overhang portions 157 of the fingers come into contact with a front side 186 of the workpiece, while the back-side 187 of the workpiece is resiliently supported on the contacts 154a, 154b, 154c, 154d of contact device 107. In this position, the workpiece also engages O-ring 198 to form a seal that protects the contacts from exposure to the plating chemistry. Further, the shoulders 180 lose contact with the workpiece W. The overhang portions 157 of the fingers come into pressing contact with the front side 186 of the workpiece to hold the workpiece W against the contacts, such as the contact 154a illustrated. Because of the concave shape of each overhang portion 157, only an end 157a is in contact with the front side 186 of the workpiece W. The edge 181 moves above the guide surface 156 and away from the vertical legs 155. The lead-in pins, such as pin 153a illustrated, drop to a position below the workpiece W. This prevents unwanted plating or wicking of process fluids on the edge 181 or back side of the workpiece W. The lead-in pins 153a, 153b are lowered with the frame below a lead edge 184 and the trailing edge 182 of the workpiece W.

After the workpiece W has been clamped against the back-side contact device 107, the processing head 12 can be driven to a position in which it engages the electroplating bowl assembly 14 for processing of the workpiece W. With reference to the specific embodiment of the reactor shown in FIG. 2, the processing head 12 mates with the processing bowl assembly 14 to form a substantially closed processing volume 13 during workpiece processing. As illustrated, the processing head 12 is preferably supported by a head position controller 52. The head position controller 52 of the disclosed embodiment includes a linear drive 53 which is used to adjust the height of the processing head 12 with respect to the bowl assembly 14. The head position controller 52 of the disclosed embodiment also includes a head rotor drive 54 which operates to rotate the processing head 12 about a horizontal axis 55. The rotational movement of the processing head 12 allows it to be placed in a first position (illustrated in FIGS. 15A–16D) for loading and unloading a workpiece and a second position shown in FIG. 2 in which the front side of the workpiece is exposed for contact with the upper surface of the plating solution in the bowl assembly 14. A variety of drives which provide linear and/or rotational drive movement are suitable for use in the illustrated system. Although the disclosed embodiment illustrates a processing head 12 that rotates from the first to the second position, the wafer rotor assembly 100 may be modified to make such rotation unnecessary.

In operation, plating chemistry is provided to the cup through a delivery tube 44 and proceeds therefrom through fluid outlet openings 56. The fluid then proceeds around anode 42 and through a perforated diffusion plate 66. An upper edge of side wall 60 forms a weir which limits the level of process fluid within the cup. Excess solution pours over this wier and into the reservoir chamber 18. The spent liquid from chamber 18 is preferably returned to a reservoir where it can be treated with additional plating chemicals and used again.

After processing is complete, the processing head 12 returns to the first position. In this position, actuators 94a, 94b, 94c are activated to drive the thrust ring 98 against the spring caps 118 (see FIG. 7) and urge the workpiece support 120 to the position shown in FIG. 15F. The end effector 170 can then be inserted beneath the workpiece W to allow the end effector 170 to lift the workpiece above the lead-in pin 153a. The workpiece is then withdrawn from the processing head 12 in a reverse manner to its original insertion.

Because the vertical legs of the fingers and the lead-in geometry separates from the workpiece in the final processing position, plating is prevented from occurring on the edge or back side of the workpiece. Only the front surface of the workpiece is substantially in contact with the plating chemistry and there is no path for the plating chemistry to wick to the edge or the back side of the workpiece.

The cantilever leaf spring design for the electrical contacts has several advantages. The contacts and the common plate can be designed from a single piece of material, greatly simplifying part design and improved reliability. Also, the contact design allows each contact to be resilient or compliant, ensuring sufficient contact is made by each electrical contact to the rigid surface defined by the back side of the workpiece. Additionally, a distal end or contact point of each contact undergoes a slight "scraping" motion across the surface of the workpiece as it comes into contact with the workpiece as the contact leaf spring deflects. This scraping action is beneficial because it allows the contact point to break through any oxide films or contaminants which may interfere with the quality of the electrical contact to the workpiece surface.

FIGS. 17A and 17B illustrate to manners in which conductive contacts can be formed on the back-side of the workpiece to conduct plating power to the front-side thereof. In FIG. 17A, a plurality of conducting lines, such as at 400, are provided on the workpiece and proceed from the back-side to the front-side around the peripheral edge of the workpiece. In FIG. 17B, a plurality of conducting plugs, such as at 410, extend through the workpiece to connect metallization at the front-face of the workpiece to contacts 415 on the back-side thereof.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. An apparatus for use in a microelectronic workpiece processing apparatus comprising:

a drive plate connected for rotation by a drive apparatus;

a hub carried on said drive plate and having an upper surface, said hub further having a plurality of electrical contacts extending resiliently above said upper surface;

a tray surrounding said hub, the tray having a first surface facing upwardly for supporting a microelectronic workpiece in a first stage of operation, and a second surface for holding said workpiece against said contacts in a second stage of operation;

an automatic actuator connected to provide relative motion between the tray and the hub to facilitate proper placement of the tray and the hub during the first and second stages of operation.

2. The apparatus of claim 1 wherein said second surface comprises a plurality fingers, each having a substantially vertical leg and an inwardly directed overhanging portion, said first surface comprising a shoulder arranged below each overhanging portion.

3. The apparatus of claim 1 wherein a clearance between said first and second surfaces allow a transverse movement of the workpiece between the first and second surfaces.

4. The apparatus of claim 1 wherein said contacts are carried on a common plate and said common plate is fastened to said hub.

5. The apparatus of claim 4 wherein said common plate is fastened to a backside of said hub and said hub includes apertures for receiving said contacts from said common plate, and said contacts extend beyond a front side of said hub.

6. The apparatus of claim 5 wherein said common plate is cross-shaped and is fastened to said hub at a center of said common plate.

7. The apparatus of claim 4 wherein said common plate is fastened by an electrode which also serves as electric contact for said common plate.

8. The apparatus of claim 1 wherein said electrical contacts are carried on leaf springs.

9. The apparatus of claim 1 including an O-ring arranged around said contacts and seals against said workpiece in the second stage of operation.

10. The apparatus of claim 1 wherein said first and second surfaces form opposing C-shaped channels that are dimensioned to allow side-loading of the workpiece onto the tray.

* * * * *

UNITED STATES PATENT AND TRADEMARK OFFICE
CERTIFICATE OF CORRECTION

PATENT NO.       : 6,527,926 B2
DATED            : March 4, 2003
INVENTOR(S)      : Woodruff et al.

It is certified that error appears in the above-identified patent and that said Letters Patent is hereby corrected as shown below:

<u>Title page,</u>
Item [56], References Cited, U.S. PATENT DOCUMENTS, "5,276,976" should be -- 5,275,976 --;

<u>Column 4,</u>
Line 59, "workpiece," should be -- workpiece. --;

<u>Column 6,</u>
Line 47, "tormed" should be -- formed --;

Signed and Sealed this

Second Day of September, 2003

JAMES E. ROGAN
*Director of the United States Patent and Trademark Office*